(12) United States Patent
Mobed

(10) Patent No.: US 9,072,186 B2
(45) Date of Patent: Jun. 30, 2015

(54) HARNESS ASSEMBLY

(71) Applicant: Darius Darayes Mobed, Watertown, MA (US)

(72) Inventor: Darius Darayes Mobed, Watertown, MA (US)

(73) Assignee: Bose Corporation, Framingham, MA (US)

( * ) Notice: Subject to any disclaimer, the term of this patent is extended or adjusted under 35 U.S.C. 154(b) by 148 days.

(21) Appl. No.: 13/909,440

(22) Filed: Jun. 4, 2013

(65) Prior Publication Data
US 2014/0355233 A1 Dec. 4, 2014

(51) Int. Cl.
| H01B 7/00 | (2006.01) |
| H05K 7/10 | (2006.01) |
| G08B 13/12 | (2006.01) |
| G06F 1/16 | (2006.01) |
| H01R 13/58 | (2006.01) |
| H01B 1/20 | (2006.01) |
| G08B 13/14 | (2006.01) |
| G08B 23/00 | (2006.01) |
| H01R 31/06 | (2006.01) |

(52) U.S. Cl.
CPC ............... *H05K 7/10* (2013.01); *G08B 13/126* (2013.01); *G08B 13/1418* (2013.01); *G08B 13/1409* (2013.01); *G08B 13/14* (2013.01); *G06F 1/1632* (2013.01); *H01R 13/582* (2013.01); *H01R 31/06* (2013.01)

(58) Field of Classification Search
CPC ............... G08B 13/1445; G08B 13/14; G08B 13/1409; G08B 13/1418
USPC .......... 340/568.1, 568.2, 568.3, 568.4, 568.5, 340/568.6, 568.7, 568.8, 687, 693.9; 361/826, 827, 828; 174/135
See application file for complete search history.

(56) References Cited

U.S. PATENT DOCUMENTS

| 7,007,912 B1 | 3/2006 | Giuliani et al. |
| 7,202,786 B2 * | 4/2007 | Marszalek et al. ......... 340/568.3 |
| 2012/0268103 A1 | 10/2012 | Henson et al. |

* cited by examiner

*Primary Examiner* — Hoa C Nguyen
*Assistant Examiner* — Binh Tran
(74) *Attorney, Agent, or Firm* — Brian M. Dingman; Dingman, McInnes & McLane, LLP

(57) ABSTRACT

An assembly for physically securing, and providing data and power to, a portable electronic consumer product that has opposed sides that each include one or more protrusions or depressions, where the portable electronic consumer product also has an electrical power input connector and a data input connector. The assembly has first and second separate housing portions that are constructed and arranged to be separably coupled together to thereby define a housing. The first and second housing portions each define one or more protrusions or depressions that complement the depressions or protrusions on a side of the portable electronic consumer product such that the housing forms a tight locational clearance fit with the consumer product when the first and second housing portions are coupled together around the opposed sides of the consumer product. There is a cord assembly that is constructed and arranged to carry electrical power and data, the cord assembly located in part inside the housing. There is a housing power connector that terminates the power carried by the cord assembly, and a housing data connector that terminates the data carried by the cord assembly; these connectors are both carried by the housing.

22 Claims, 19 Drawing Sheets

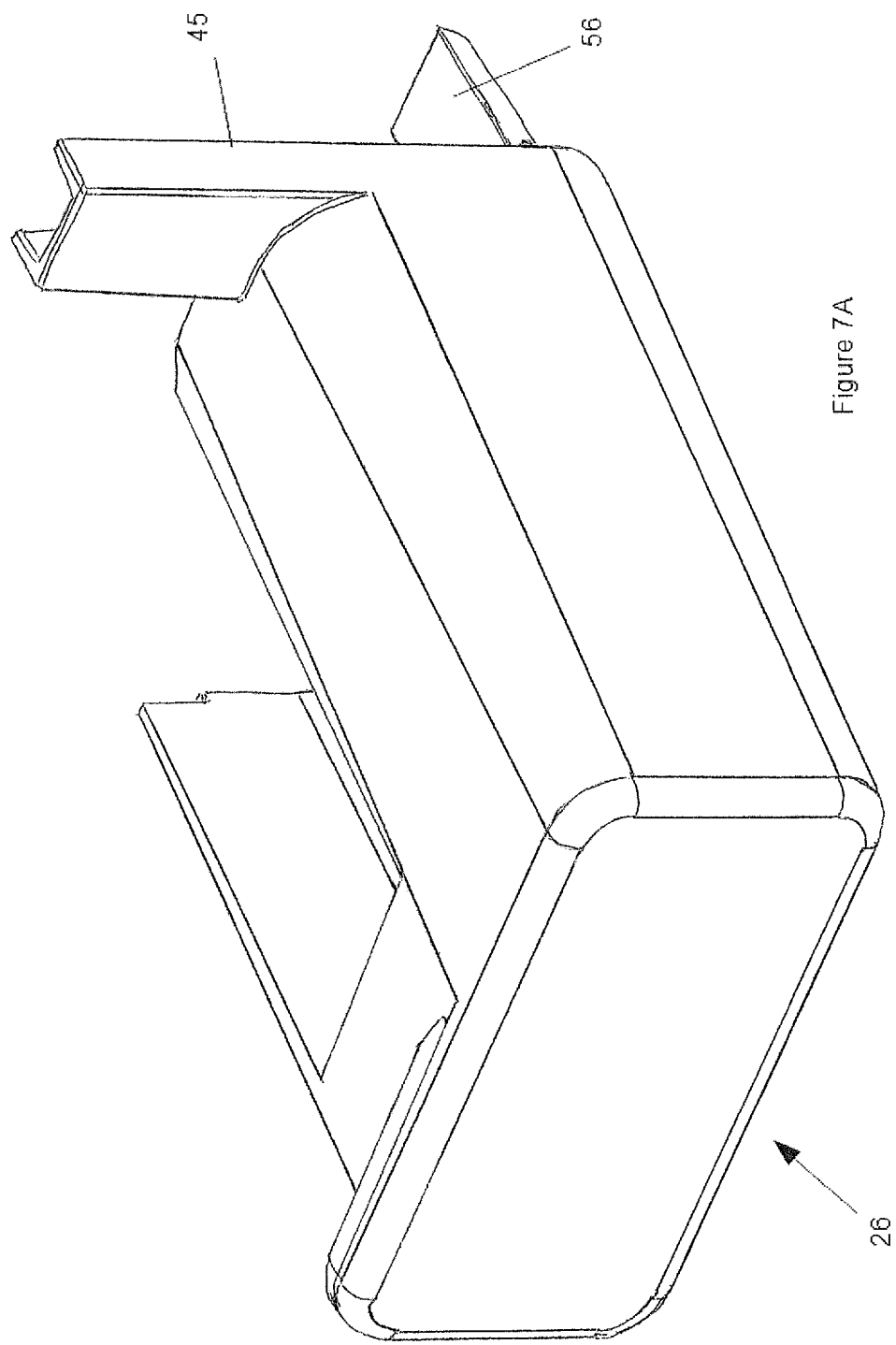

HARNESS ASSEMBLY

BACKGROUND

This disclosure relates to an electrical harness for a merchandise display.

Portable electronic consumer products are often displayed by retailers. Sales are supported if the products are operable while being displayed. Thus data and power need to be provided to the products.

It is also useful to be able to secure the products to deter theft. This is often accomplished by adhering an anchor to the product and then running a strong tether from the anchor to a fixed location. However the anchor may mar or destroy the surface, which makes it difficult or impossible to sell the displayed product. Also, the anchor may interfere with the product's functionality. Such anchors are thus an additional expense and an inconvenience.

SUMMARY

A harness assembly is disclosed which has a cord that is used to provide both data and power connections to a portable electronic consumer product at retail display. The harness assembly includes a housing that is releasably couplable to the consumer product and has features that complement depressions or protrusions on opposed sides of the consumer product such that the housing tightly couples to the product. When the cord is secured, it tethers the product to inhibit theft. A single harness assembly thus helps secure the product without marring its surface and provides the necessary power and data to operate the consumer product.

All examples and features mentioned below can be combined in any technically possible way.

In one aspect, a harness assembly for physically securing, and providing data and power to, a portable electronic consumer product that has opposed sides that each include one or more protrusions or depressions, where the portable electronic consumer product also has an electrical power input connector and a data input connector, includes first and second separate housing portions that are constructed and arranged to be separably coupled together to thereby define a housing with an interior, wherein the first and second housing portions each define one or more protrusions or depressions that complement the depressions or protrusions on a side of the portable electronic consumer product such that the housing forms a tight locational clearance fit with the consumer product when the first and second housing portions are coupled together around the opposed sides of the consumer product. There is also a cord assembly that is constructed and arranged to carry electrical power and data. The cord assembly is located in part inside the housing. There is a housing power connector that terminates the power carried by the cord assembly and is constructed and arranged to electrically couple with the power input connector of the consumer device. A housing data connector terminates the data carried by the cord assembly and is constructed and arranged to electrically couple with the data input connector of the consumer device. The housing power connector and the housing data connector are both carried by the housing.

Embodiments may include one of the following features, or any combination thereof. The opposed sides of the consumer product may have a protruding ridge, and the first and second housing portions may each define a complementary slot that fits over a ridge when the first and second housing portions are coupled together around the consumer product. The consumer product may have a generally rectangular parallelepiped shape with a generally rectangular front face and a generally rectangular rear face that are both framed by a thin housing envelope member that protrudes slightly from both faces to define the ridges. The first and second housing portions may each be constructed and arranged to engage two adjacent edges of the housing envelope member. The first and second housing portions may each have two slots that lie along generally orthogonal axes, where each slot is constructed and arranged to engage one edge of the housing envelope member. The first and second housing portions may each have one or more slots, where the slots are constructed and arranged to engage the two adjacent edges of one face of the consumer product.

Additional embodiments may include one of the above and/or below features, or any combination thereof. The consumer product may have two intersecting edges on each opposed side, and the first and second housing portions may each define features that are complementary to the two intersecting edges on one side of the consumer product. The assembly may further include an electrical assembly located in the housing interior, where the housing power connector and the housing data connector are part of the electrical assembly. The electrical assembly may be removably captured by mechanical features on the insides of the housing portions. The electrical assembly may comprise a printed circuit board (PCB) that defines a top face. The housing power connector and the housing data connector may comprise spring contacts that protrude from the top face of the PCB.

The first and second housing portions may be constructed and arranged to engage with each other along a coupling axis, and the top face of the PCB may be generally parallel to the coupling axis. The housing may have a top and an adjacent side, the top and side both being partially open so as to define an opening that is constructed and arranged such that a corner of the consumer product fits snugly into the opening and the spring contacts thereby become electrically coupled to pads located on a surface of the consumer product, where the pads define the electrical power input connector and the data input connector. The electrical power and the data may be carried by separate conductors of the cord assembly, and there may be a multiple conductor plug at an end of the cord and that is electrically coupled to the power and data cord conductors. The cord assembly may further comprise an audio cord that carries audio data and is located in part in the housing. The audio cord may terminate in a plug that is constructed and arranged to be plugged into an audio jack of the consumer product, wherein the audio cord is held in the housing at a location close to the plug. The housing may have a top surface and a tower that projects from the top surface and has a top opening, where the audio cord runs through the tower and exits through its top opening.

In another aspect, an assembly for physically securing, and providing data and power to, a portable electronic consumer product that has opposed sides that each include one or more protrusions or depressions and two intersecting edges, where the portable electronic consumer product also has an electrical power input connector and a data input connector, includes first and second separate housing portions that are constructed and arranged to be separably coupled together to thereby define a housing with an interior, wherein the first and second housing portions each define features that are complementary to the two intersecting edges on one side of the consumer product such that the housing forms a tight locational clearance fit with the consumer product when the first and second housing portions are coupled together around the opposed sides of the consumer product. There is a cord assembly that is constructed and arranged to carry electrical power and data, the cord assembly located in part inside the housing, and a housing power connector that terminates the power carried by the cord assembly and is constructed and arranged to electrically couple with the power input connector of the consumer device. A housing data connector terminates the data carried by the cord assembly and is constructed and arranged to electrically couple with the data input connector of the consumer device. A printed circuit board (PCB) defines a top face and is located in the housing interior, where the housing power connector and the housing data connector comprise spring contacts that protrude from the top face of the PCB.

Embodiments may include one of the above and/or below features, or any combination thereof. The consumer product may have a generally rectangular parallelepiped shape with a generally rectangular front face and a generally rectangular rear face that are both framed by a thin housing envelope member that protrudes slightly from both faces to define ridges on two adjacent edges, and the first and second housing portions may each have two slots that lie along generally orthogonal axes and that each fit over a ridge when the first and second housing portions are coupled together around the consumer product.

In another aspect, an assembly for physically securing, and providing data and power to, a portable electronic consumer product that has opposed sides that each include one or more protrusions or depressions, wherein the consumer product has a generally rectangular parallelepiped shape with a generally rectangular front face and a generally rectangular rear face that are both framed by a thin housing envelope member that protrudes slightly from both faces to define ridges on two adjacent edges, and where the portable electronic consumer product also has an electrical power input connector and a data input connector, includes first and second separate housing portions that are constructed and arranged to be separably coupled together to thereby define a housing with an interior, wherein the first and second housing portions each have two slots that lie along generally orthogonal axes and that each fit over a ridge when the first and second housing portions are coupled together around the opposed sides of the consumer product such that the housing forms a tight locational clearance fit with the consumer product. There is a cord assembly that is constructed and arranged to carry electrical power, data and audio signals, the cord assembly located in part inside the housing. A housing power connector terminates the power carried by the cord assembly and is constructed and arranged to electrically couple with the power input connector of the consumer device and a housing data connector terminates the data carried by the cord assembly and is constructed and arranged to electrically couple with the data input connector of the consumer device. A printed circuit board (PCB) defines a top face and is located in the housing interior and is removably captured by mechanical features on the insides of the housing portions, where the housing power connector and the housing data connector comprise spring contacts that protrude from the top face of the PCB. The first and second housing portions are constructed and arranged to engage with each other along a coupling axis, wherein the top face of the PCB is generally parallel to the coupling axis, and wherein the housing has a top and an adjacent side, the top and side both being partially open so as to define an opening that is constructed and arranged such that a corner of the consumer product fits snugly into the opening and the spring contacts thereby become electrically coupled to pads located on a surface of the consumer product, where the pads define the electrical power input connector and the data input connector.

The audio cord terminates in a plug that is constructed and arranged to be plugged into an audio jack of the consumer product, wherein the audio cord is held in the housing at a location close to the plug, and wherein the housing has a tower that projects from its top surface and has a top opening, and the audio cord runs through the tower and exits through its top opening.

In another aspect, a merchandise display for a portable electronic consumer product that has opposed sides that each include one or more protrusions or depressions, where the portable electronic consumer product also has an electrical power input connector member and a data input connector member, includes a display structure comprising a deck that is constructed and arranged to support the consumer product, and a harness assembly for physically securing, and providing data and power to, the consumer product. The harness assembly comprises first and second housing portions that are constructed and arranged to be separably coupled together to thereby define a housing with an interior, wherein the first and second housing portions each define one or more protrusions or depressions that complement the depressions or protrusions on a side of the portable electronic consumer product such that the housing forms a tight locational clearance fit with the consumer product when the first and second housing portions are coupled together around the opposed sides of the consumer product. There is a cord assembly that is constructed and arranged to carry electrical power and data, the cord assembly located in part inside the housing and also physically coupled to the merchandise display structure so as to tether the consumer product to the merchandise display. There are a plurality of electrical connectors carried by the housing and configured to establish electrical connections between the cord assembly and the consumer product, where the electrical connectors comprise a housing power connector member that terminates the power carried by the cord assembly and is constructed and arranged to electrically couple with the power input connector member of the consumer product, and a housing data connector member that terminates the data carried by the cord assembly and is constructed and arranged to electrically couple with the data input connector member of the consumer product.

Embodiments may include one of the above and/or below features, or any combination thereof. The consumer product may have a bottom and an adjacent side, where at least one of the electrical power input connector member and the data input connector member are located on the bottom surface, and where the consumer product further comprises an audio input connector member that is on the side surface, where at least one of the housing power connector member and the housing data connector member are constructed and arranged to electrically couple with the input connector members on the bottom surface of the consumer product when the housing portions are coupled together around the bottom and side of the consumer product. The consumer product may have a generally rectangular parallelepiped shape with a generally rectangular front face and a generally rectangular rear face that are both framed by a thin housing envelope member that protrudes slightly from both faces to define protruding ridges, where the first and second housing portions are each constructed and arranged to engage two adjacent edges of the housing envelope member and wherein the first and second housing portions each have two slots that lie along generally orthogonal axes, each such slot being constructed and arranged to fit over one edge of the housing envelope member. The merchandise display may include a printed circuit board (PCB) that defines a top face, where the PCB is located in the housing interior and is removably captured by mechanical features on the insides of the housing portions. The housing power connector member and the housing data connector member each comprise spring contacts that protrude from the top face of the PCB. The first and second housing portions are constructed and arranged to engage with each other along a coupling axis. The top face of the PCB is generally parallel to the coupling axis. The housing has a top and an adjacent side, the top and side both being partially open so as to define an opening that is constructed and arranged such that a corner of the consumer product fits snugly into the opening and the spring contacts thereby become electrically coupled to pads located on a surface of the consumer product, where the pads define the electrical power input connector member and the data input connector member.

BRIEF DESCRIPTION OF THE DRAWINGS

FIG. 7A is a front, top perspective view of a portion of a housing for a harness assembly.

DETAILED DESCRIPTION

Figure 1:
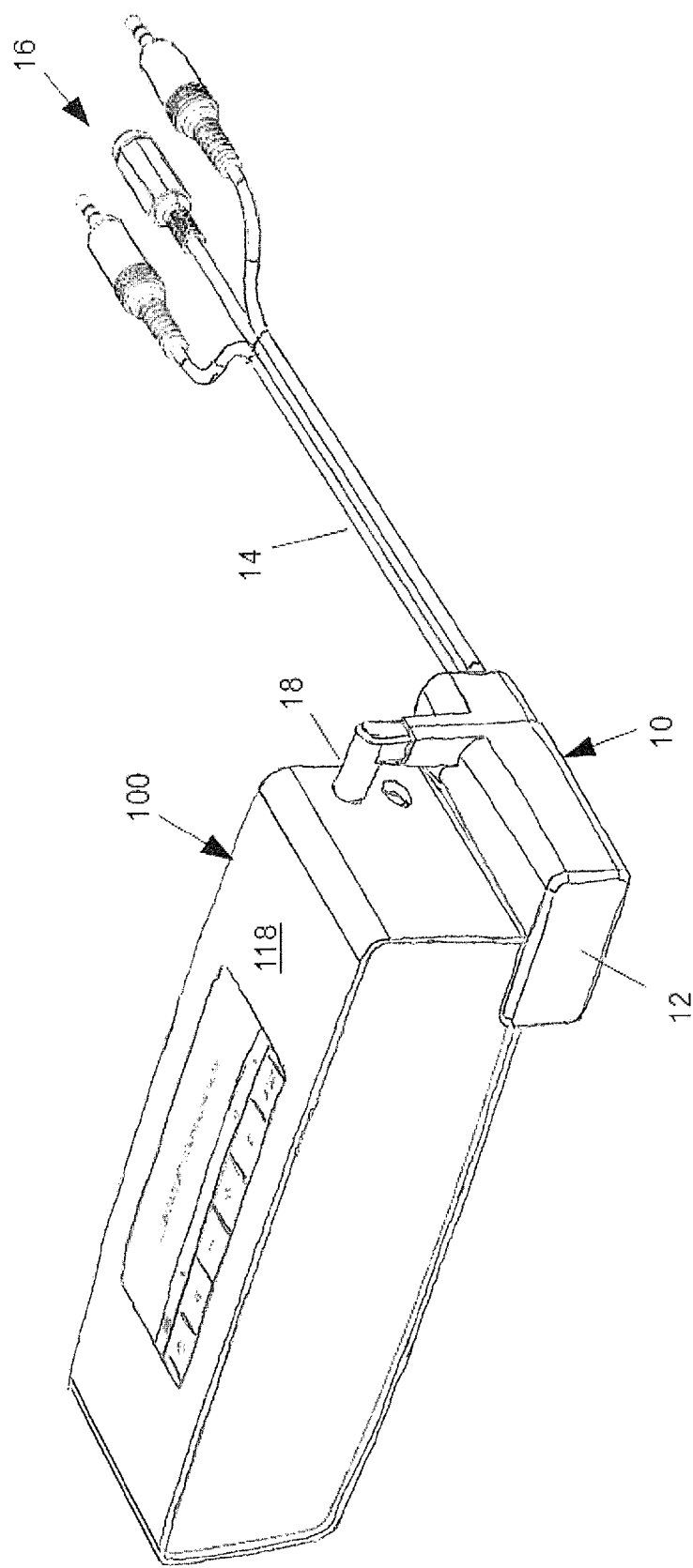
FIG. 1 is front perspective view of a harness assembly coupled to a portable electronic consumer product.
Figure 2:
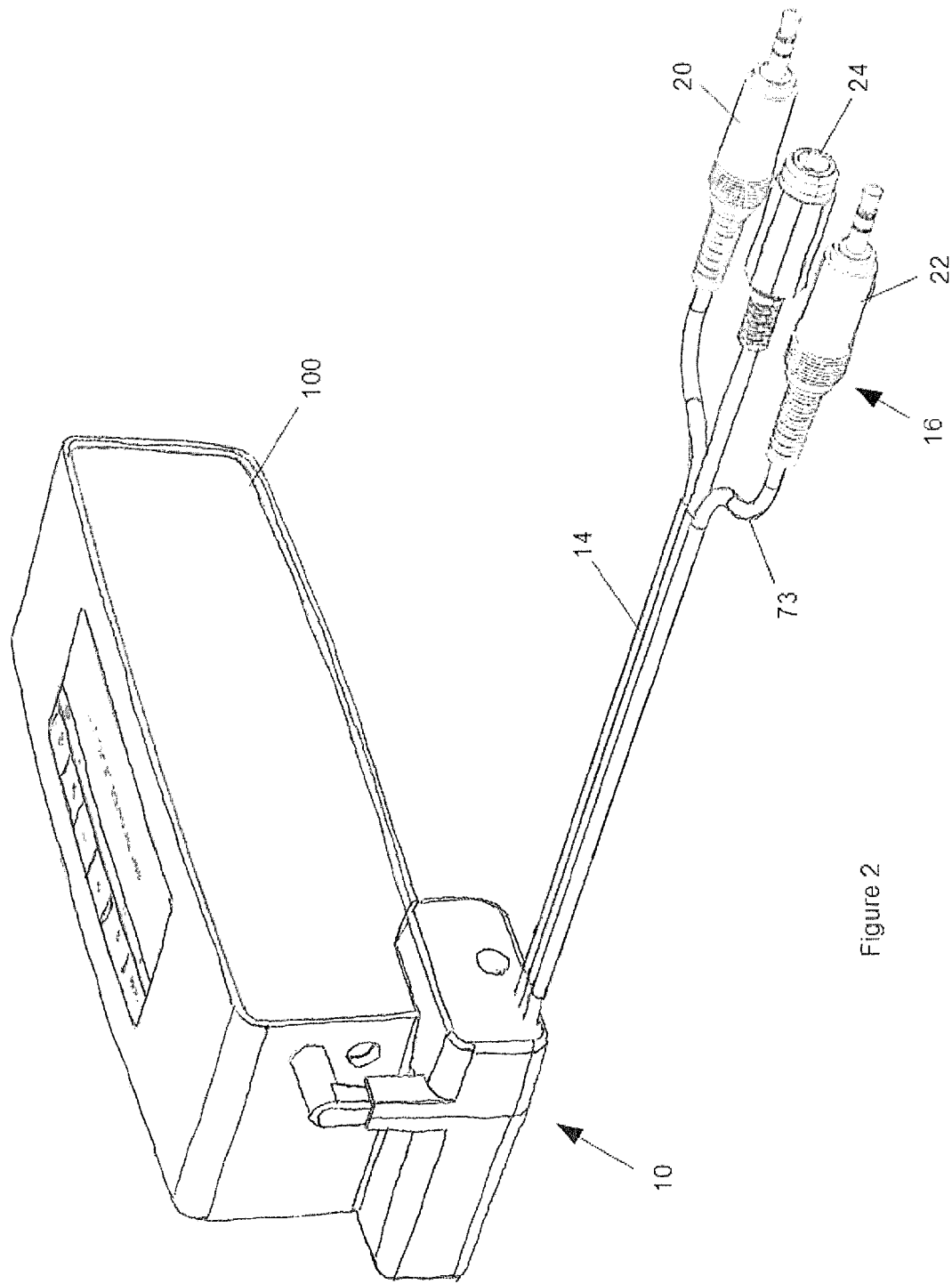
FIG. 2 is rear perspective view of a harness assembly coupled to a portable electronic consumer product.

A harness assembly that has a cord that is used to provide both data and power connections to a portable electronic consumer product at retail display. The harness assembly also has a housing that is releasably couplable to the consumer product and has features that complement depressions or protrusions on opposed sides of the consumer product such that the housing tightly couples to the product via a tight locational clearance fit. When the cord is secured, it tethers the product to inhibit theft. A single harness assembly thus helps secure the product without marring its surface and provides the necessary power and data to operate the consumer product.

A harness assembly herein is used to physically secure and provide data and power to a portable electronic consumer product. Non-limiting examples of such portable electronic consumer products include wireless loudspeakers, laptop computers, smart phones, tablets, cameras, MP3 players, gaming consoles and other handheld electronic devices. The harness assembly includes a housing that is constructed and arranged to releasably couple to opposed sides of the consumer product. The coupling is such as to form a tight locational clearance fit with protrusions and/or depressions on the consumer product so that the housing cannot be slipped off of or otherwise easily removed from the consumer product without physically distorting the housing. A cord assembly carries the data and power. The housing carries a housing power connector and a housing data connector. The housing power connector terminates the power carried by the cord assembly. The housing data connector terminates the data carried by the cord assembly. The cord assembly can also carry audio signals over an audio cord that is part of the cord assembly. The audio cord can terminate in a plug that is adapted to be plugged into an audio jack of the consumer product. The housing can include features that grip the audio cord close to the plug. This aspect further strengthens the engagement of the housing with the consumer product.

A first example of a harness assembly and the manner that the harness assembly couples to a consumer product is shown in FIGS. 1 through 13. Assembly 10 includes a housing 12 that comprises front and rear housing portions 26 and 28, both of which can be unitary, one-piece members made of plastic by injection molding. These housing portions are constructed and arranged to be separably coupled together to thereby define housing 12 that has an interior. Each of the housing portions defines one or more protrusions or depressions that complement depressions or protrusions on a side of portable electronic consumer product 100. When the housing portions are coupled together around product 100, these complementary features form a tight locational clearance fit with product 100. Accordingly, housing 12 cannot be removed from product 100 without distorting the housing.

Assembly 10 further includes cord assembly 14 that has input connector set 16. Cord assembly 14 carries at least data signals and power to consumer product 100. Housing 12 carries a housing power connector that terminates the power carried by cord assembly 14. The housing power connector is constructed and arranged to electrically couple with a power input connector of consumer device 100. Housing 12 also carries a housing data connector that terminates the data carried by cord assembly 14. This data connector is constructed and arranged to electrically couple with a data input connector of consumer device 100. In cases in which the consumer device is an audio device and audio signals are carried by cord assembly 14, housing 12 is also constructed and arranged to support an audio cord 73. Alternatively, when no digital data is needed the audio, visual or audio/visual signals can be considered the data signals and there does not need to be a separate audio cord. When the audio cord terminates with a plug, the housing can be constructed and arranged to carry and support the audio cord such that the plug is at the correct location to be plugged into the audio jack of consumer product 100 when housing 12 is coupled to product 100.

As one non-limiting example of a cord assembly input connectors set 16, the set may comprise a data input connector 20, an audio input connector 22, and a power input connector 24, each of which is typically of a type known in the art and so will not be further described herein. See FIG. 2.

In the non-limiting example shown in FIGS. 1 through 13, consumer product 100 has on opposing front and back faces 102 and 110, respectively, a protruding ridge that is the feature that is matingly engaged by the housing portions. Accordingly, each housing portion includes a complementary slot or other narrow depressed feature that is constructed and arranged to mate with the ridge and form a tight locational clearance fit between the housing and the consumer product. There is no requirement that the complementary features be a ridge and slot, however. The complementary features could include any shape or size protrusion and/or depression located on opposed sides of the consumer product and complementary shapes on the housing such that when the housing portions are coupled together the complementary features of the housing portions mate with the features of the consumer product. When the housing portions are held together tightly enough such that they cannot be easily separated sufficiently to disengage these mating features, this aspect of the housing portions tightly holds the housing on the consumer product. Since the cord assembly runs into and is captured or held by the housing, the cord assembly acts as a tether to the housing. If this tether is secured to a fixed object or location, the result is that the consumer product is effectively secured to a location, but can be picked up and moved by a consumer because the cord assembly can bend and flex. The result is that the subject harness assembly can be used to both secure a consumer product for retail display so as to inhibit the theft of the product while also providing the necessary power and data and/or audio and/or video or a/v signals that the retailer desires to provide to the consumer product.

Figure 14:
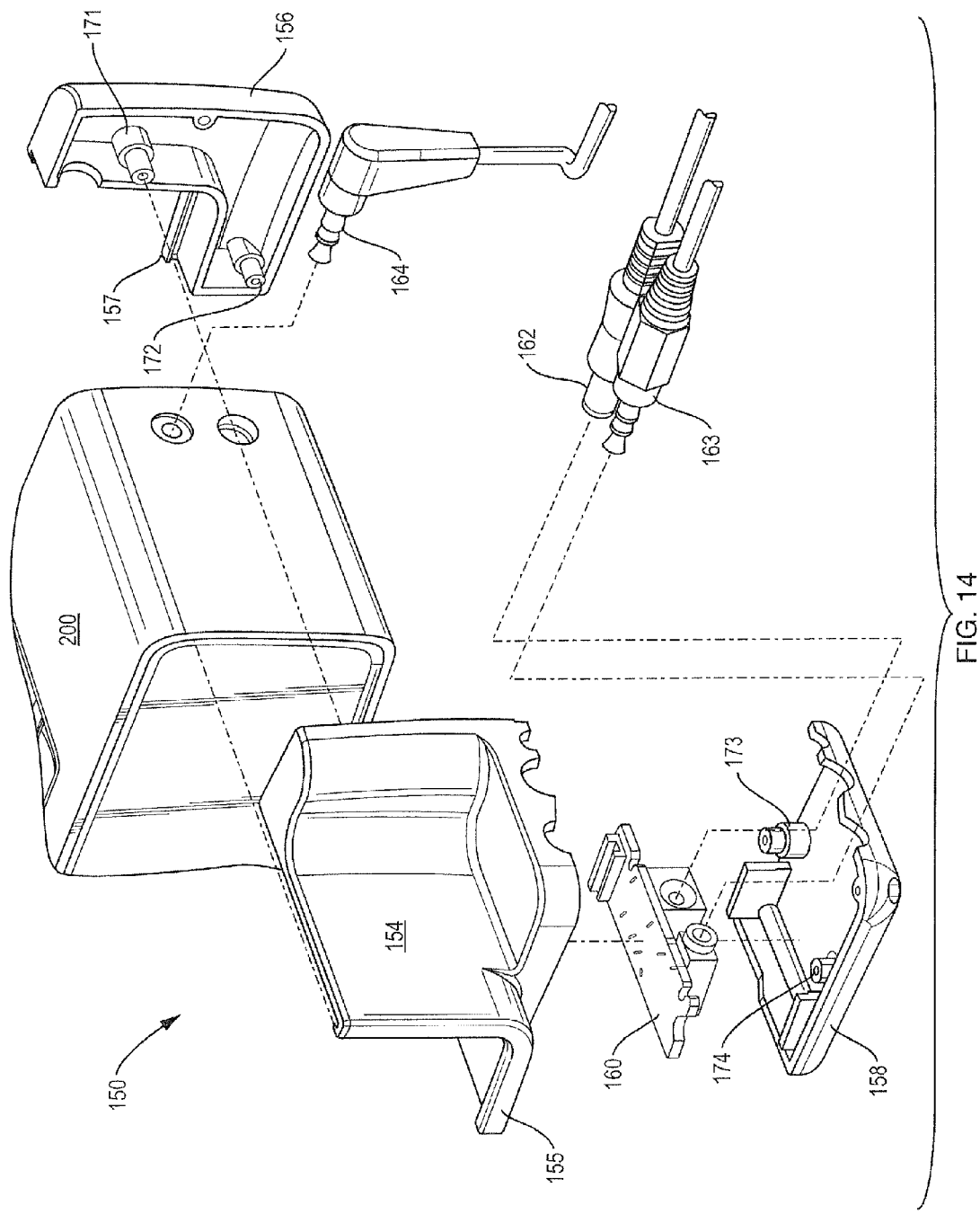
FIG. 14 is front exploded view of a second harness assembly coupled to a portable electronic consumer product.

In this non-limiting example, consumer product 100 has a generally rectangular parallelepiped shape with a generally rectangular front face and a generally rectangular rear face. The faces are both framed by a thin housing envelope member 118 (e.g., a sheet metal strip bent to shape and that is slightly wider than the width from face to face) with edges that protrude slightly from both faces to define ridges. In this example, device 100 includes such ridges or protrusions 104 and 106 that frame front face 102 (FIG. 13) and similar or identical ridges or protrusions 112 and 114 that frame rear face 110 (FIG. 14). These ridges lie along generally orthogonal sides of the product housing. When the four front and rear orthogonal ridges are gripped by complementary slots in the housing portions, the housing is coupled to both the bottom and one side of the consumer product, which makes it difficult to remove the housing from the product by pulling or twisting.

Figure 3:
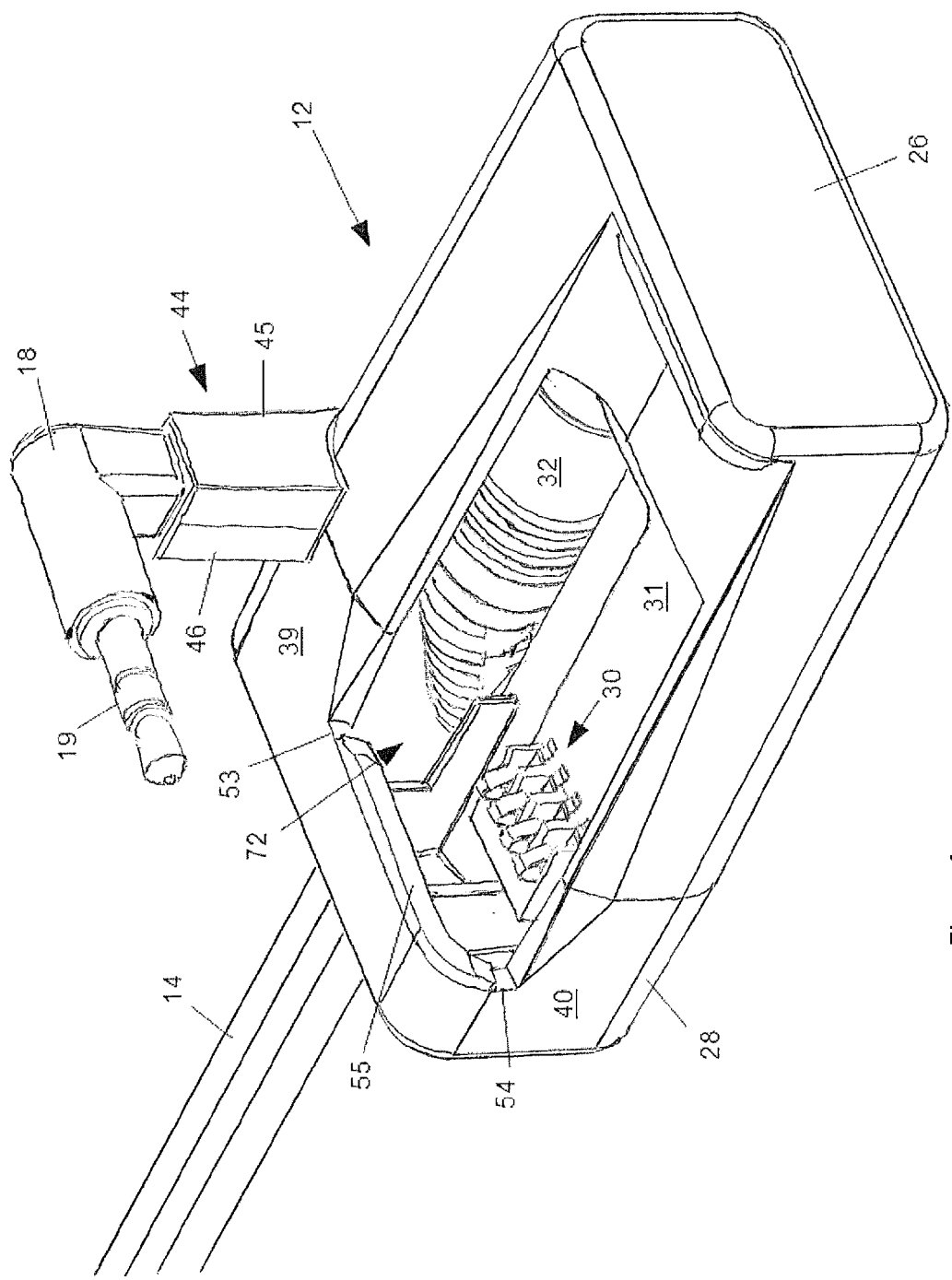
FIG. 3 is a front, top perspective view of a housing for a harness assembly.
Figure 4:
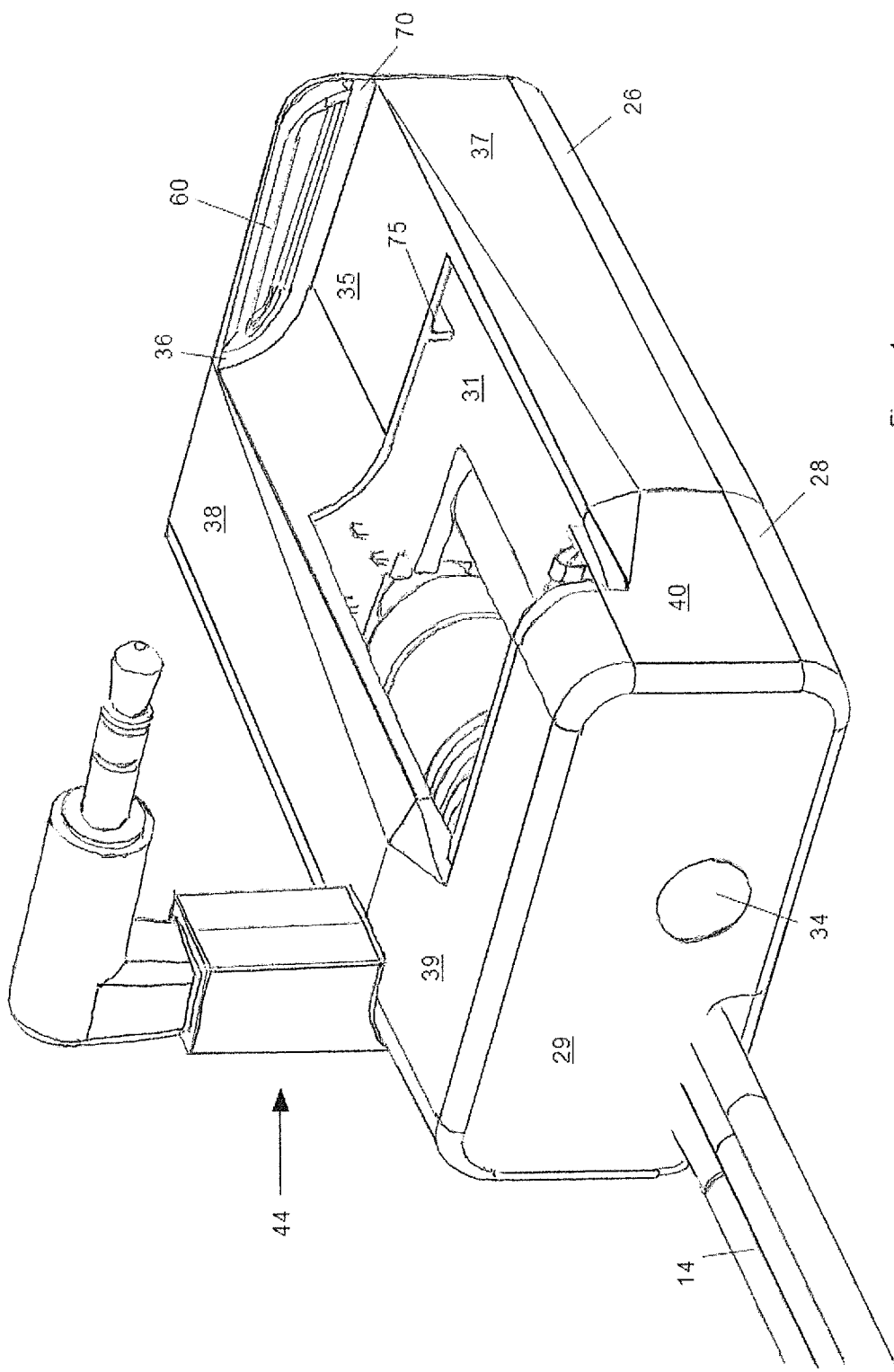
FIG. 4 is a rear, top perspective view of a housing for a harness assembly.
Figure 5:
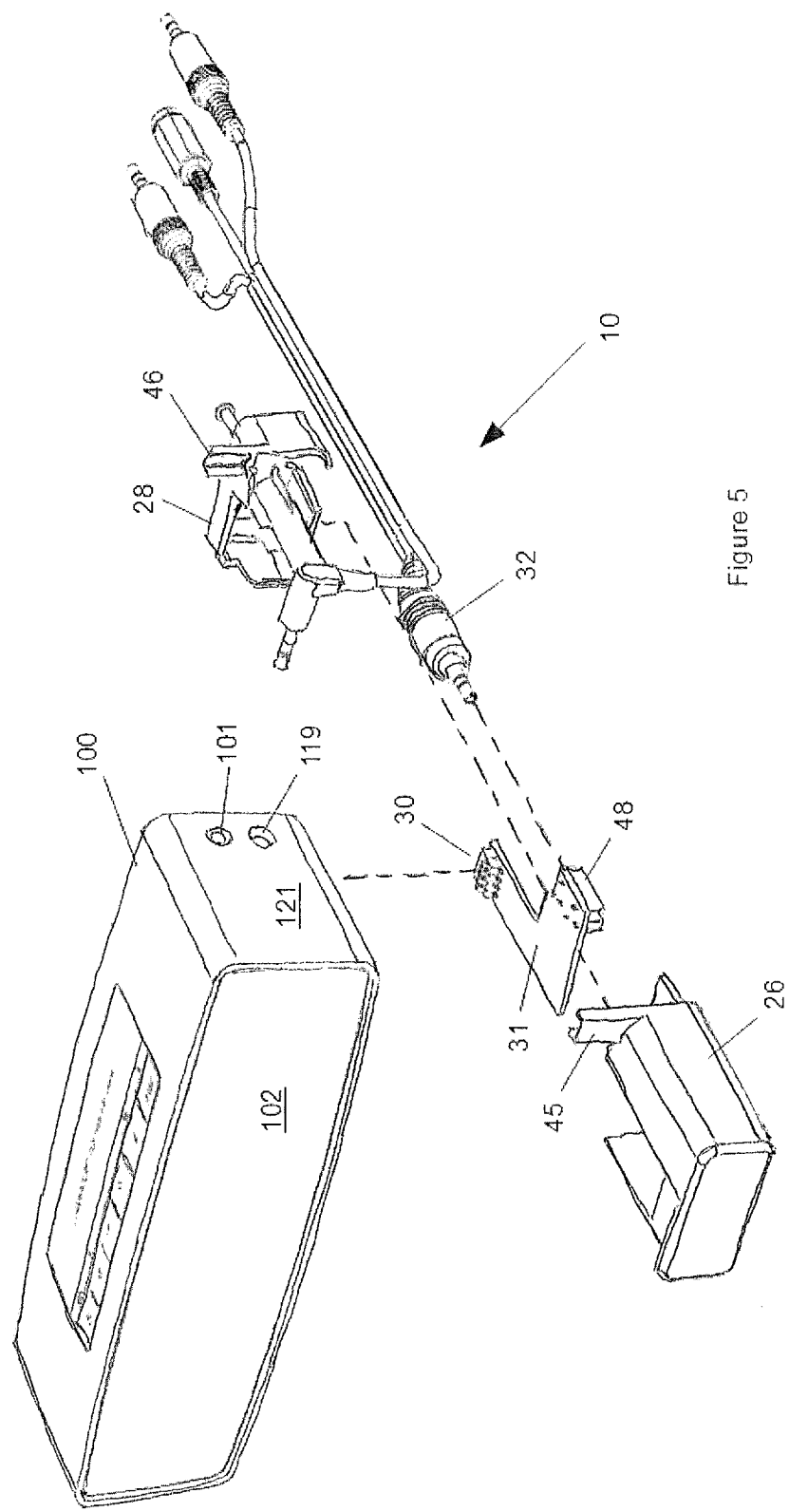
FIG. 5 is front exploded view of a harness assembly coupled to a portable electronic consumer product.
Figure 6:
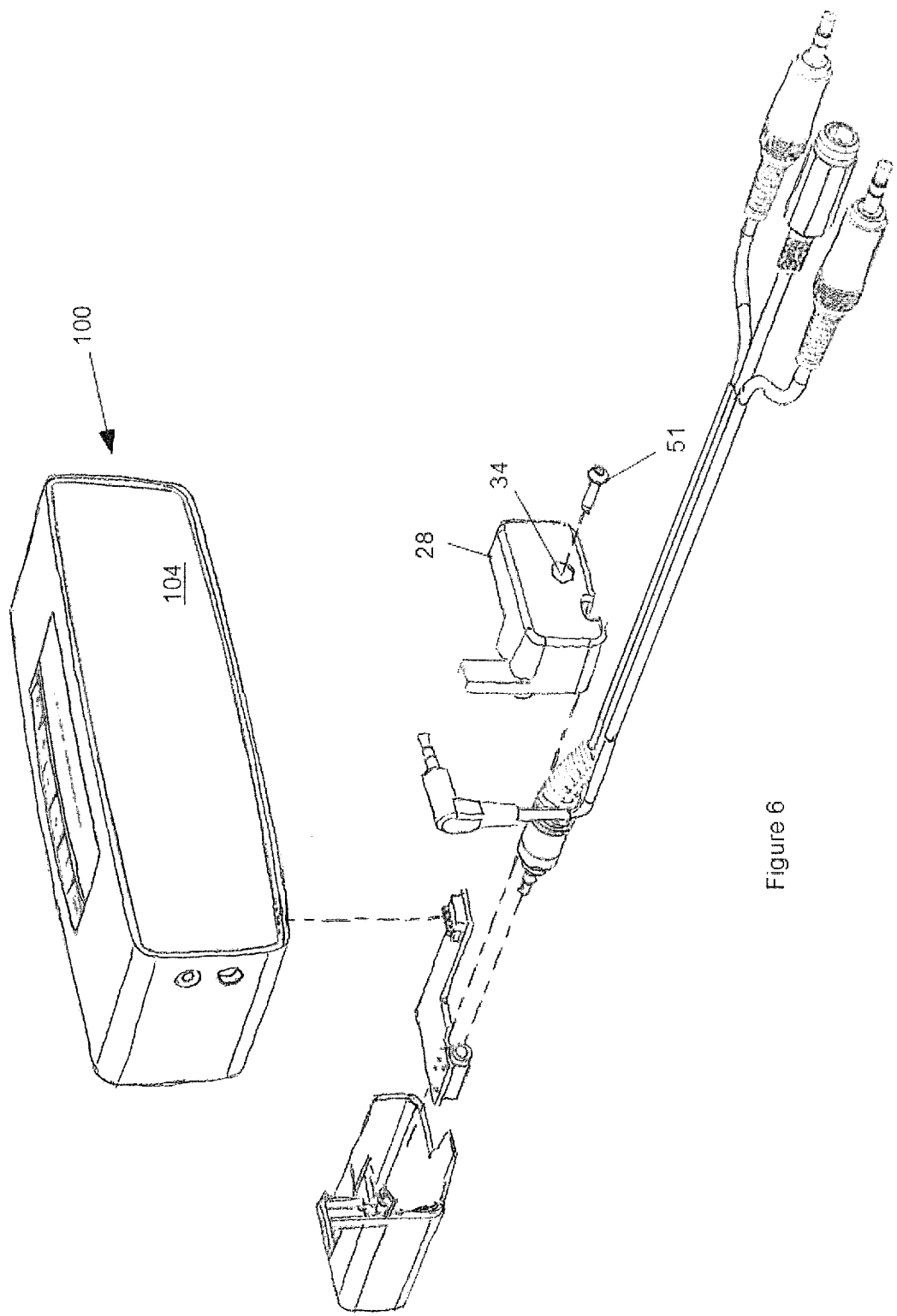
FIG. 6 is rear exploded view of a harness assembly coupled to a portable electronic consumer product.
Figure 7B:
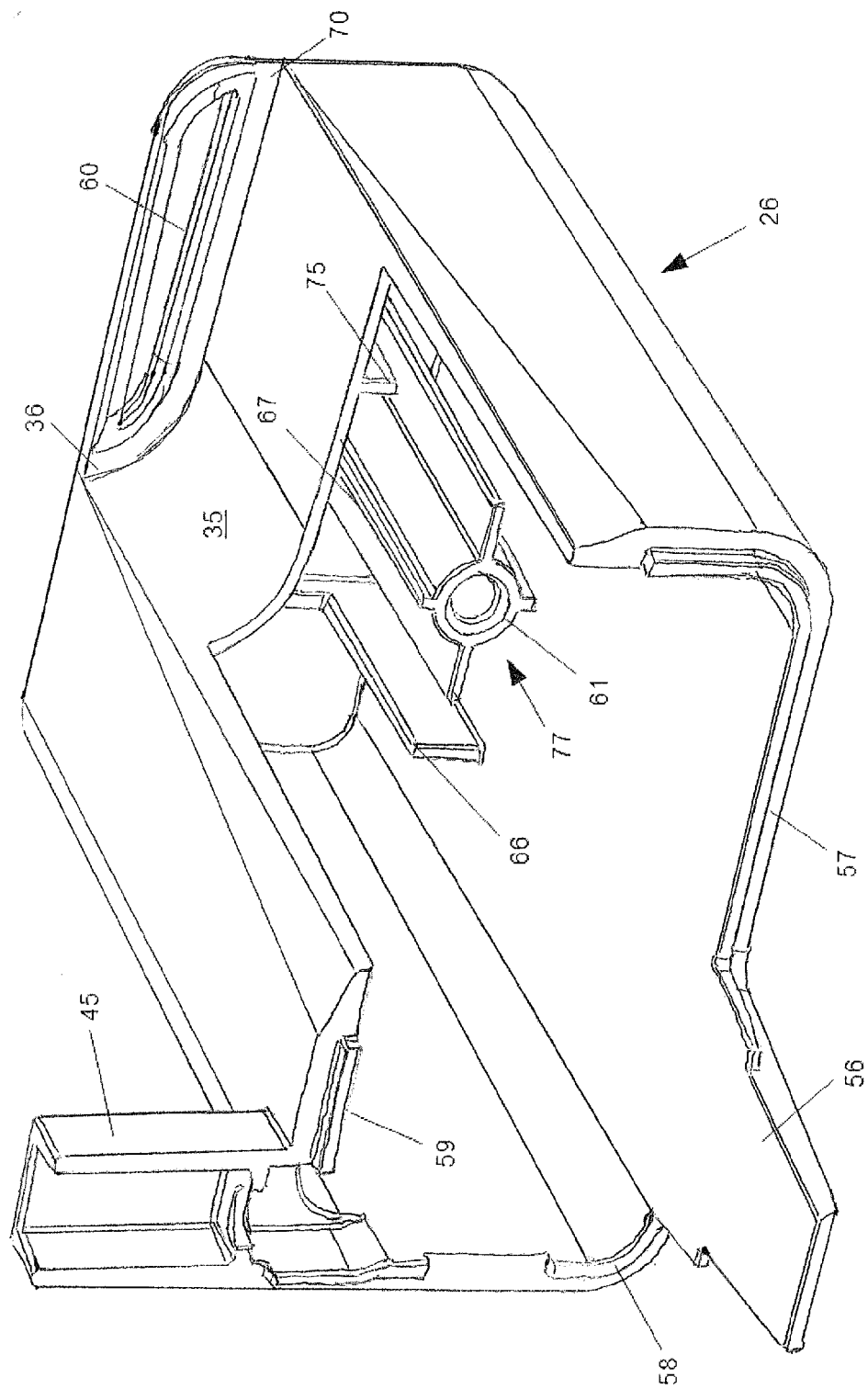
FIG. 7B is a rear, top perspective view of a portion of a housing for a harness assembly.
Figure 8A:
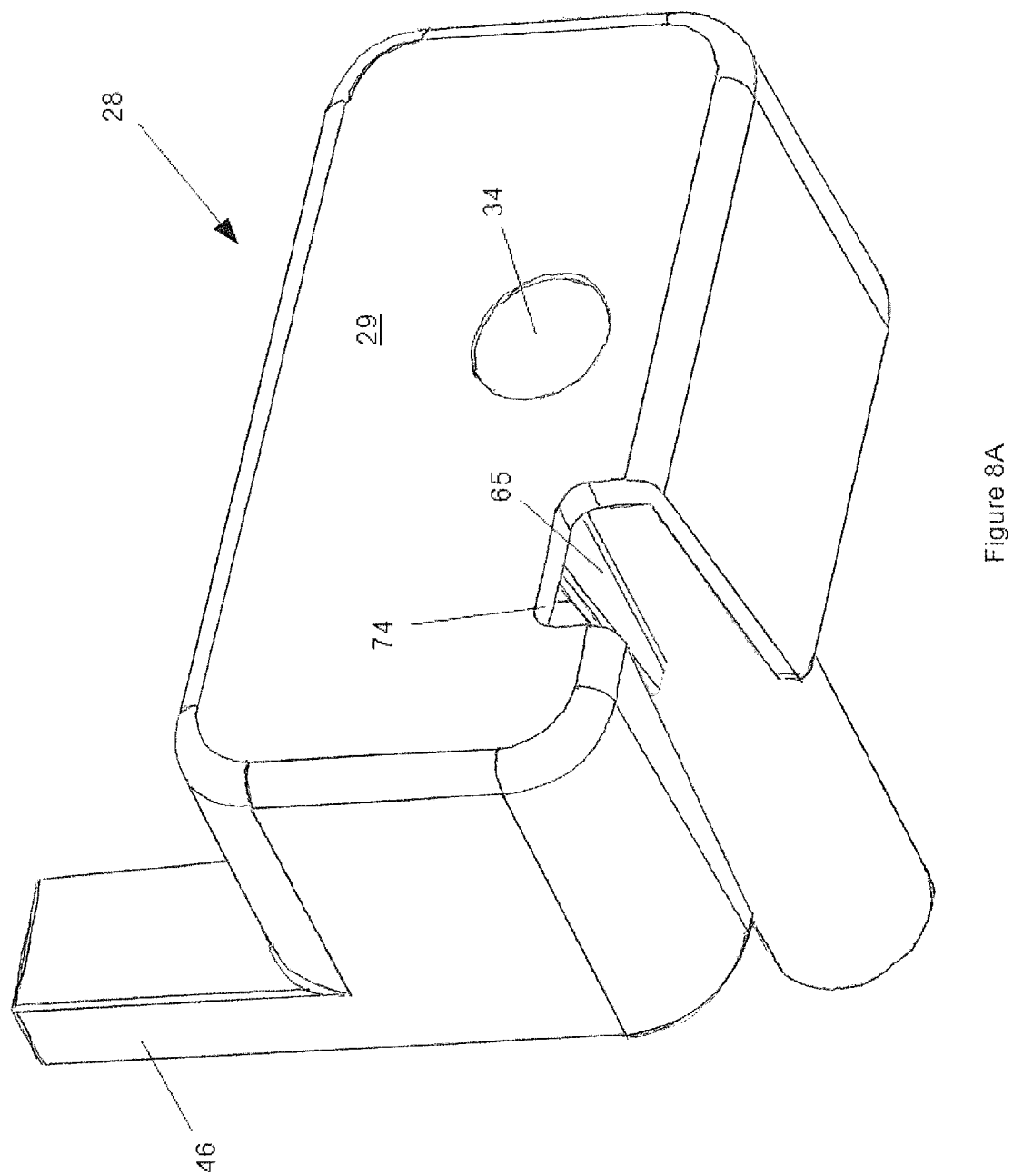
FIG. 8A is a front, bottom perspective view of a portion of a housing for a harness assembly.
Figure 8B:
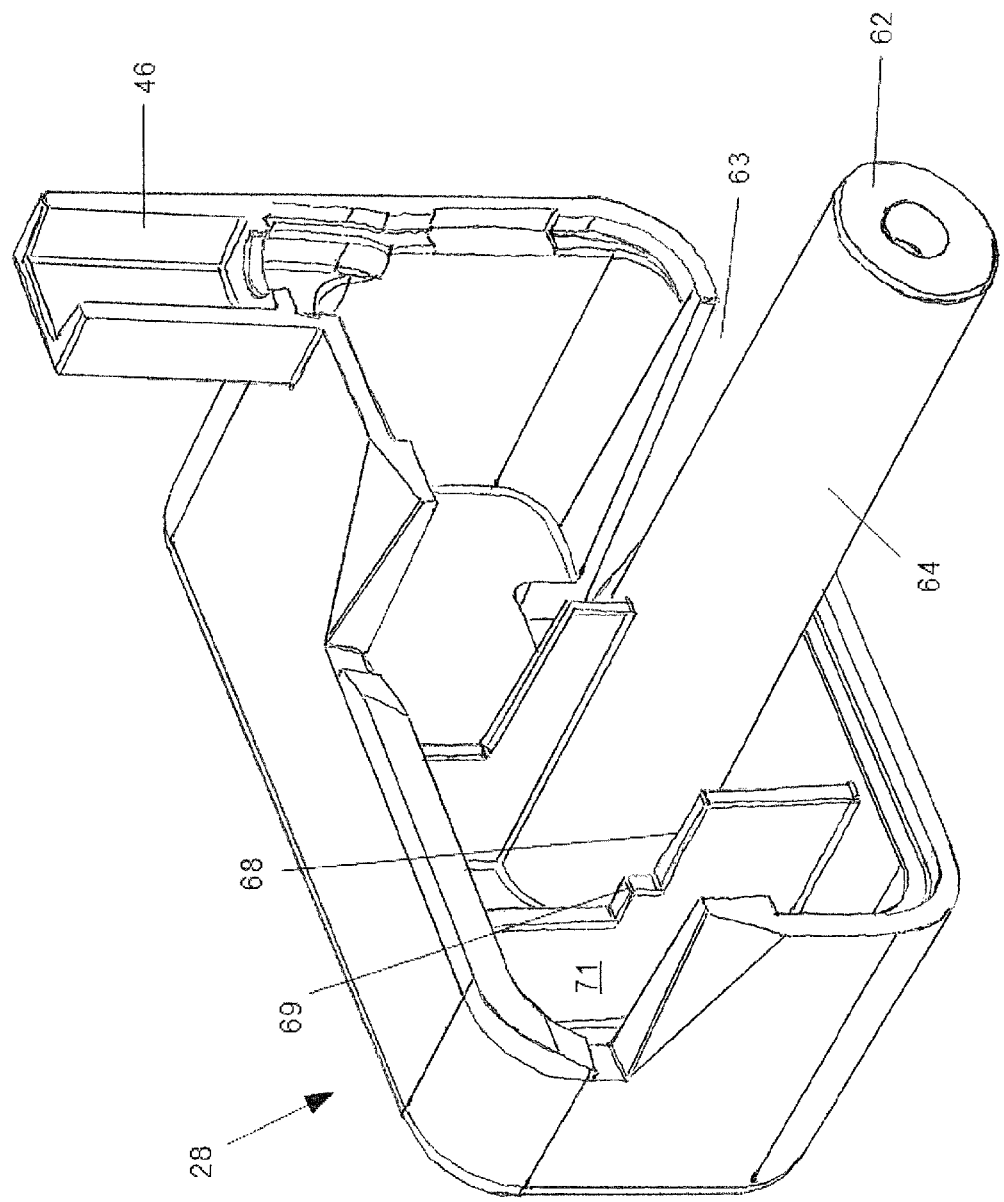
FIG. 8B is a rear, bottom perspective view of a portion of a housing for a harness assembly.
Figure 9:
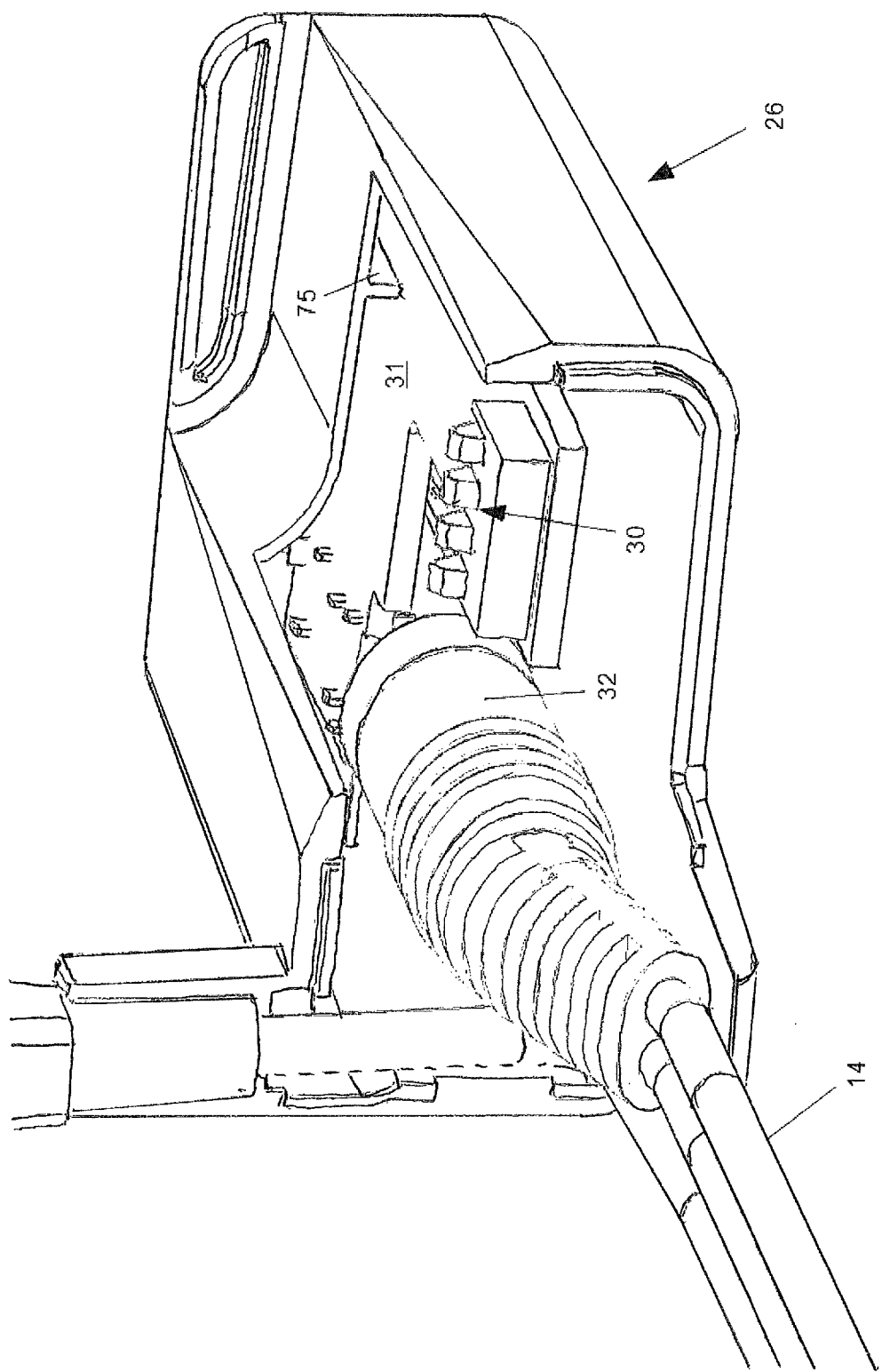
FIG. 9 shows one portion of a housing for a harness assembly.
Figure 10:
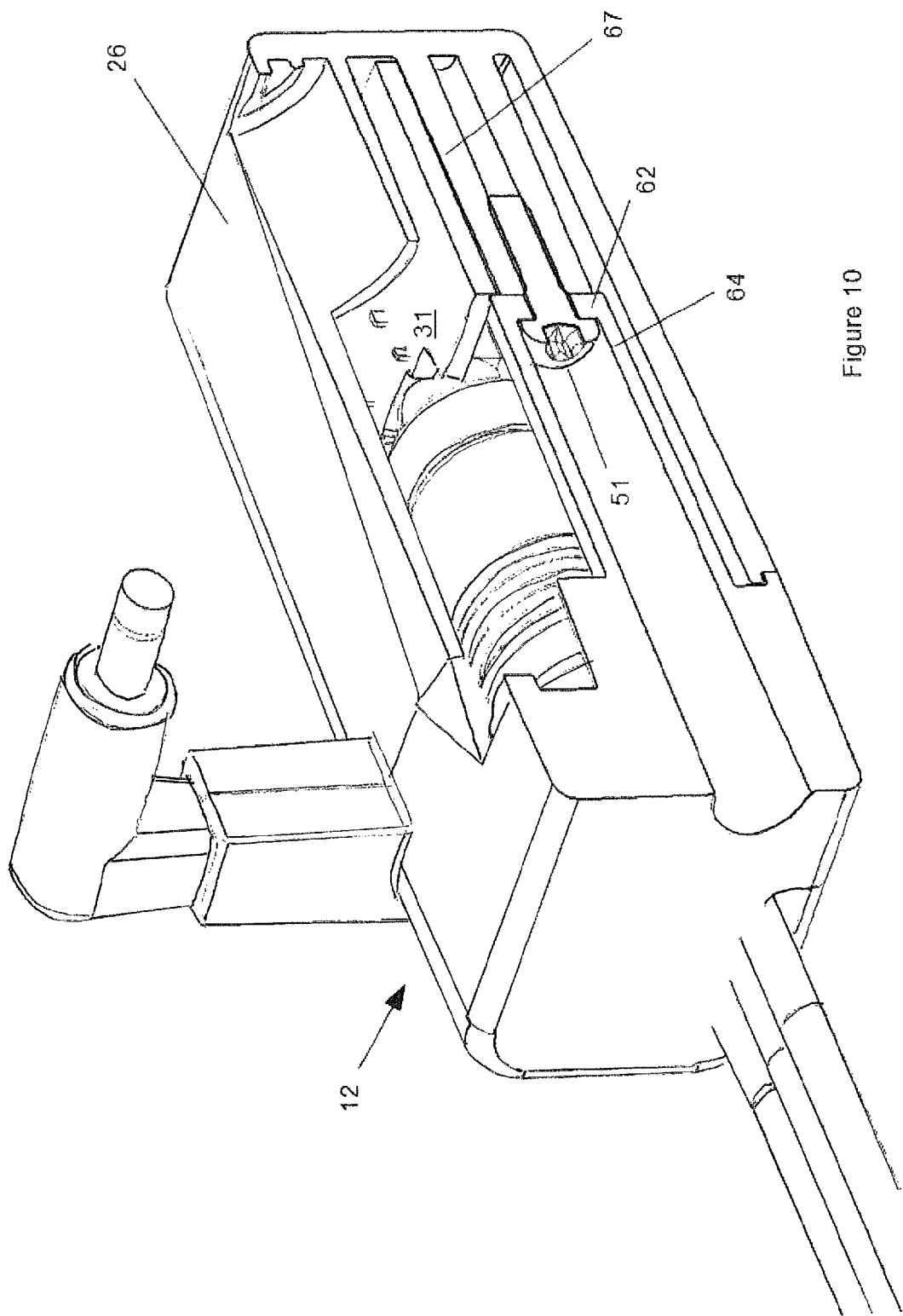
FIG. 10 is a vertical longitudinal cross-sectional view of a housing for a harness assembly.
Figure 11:
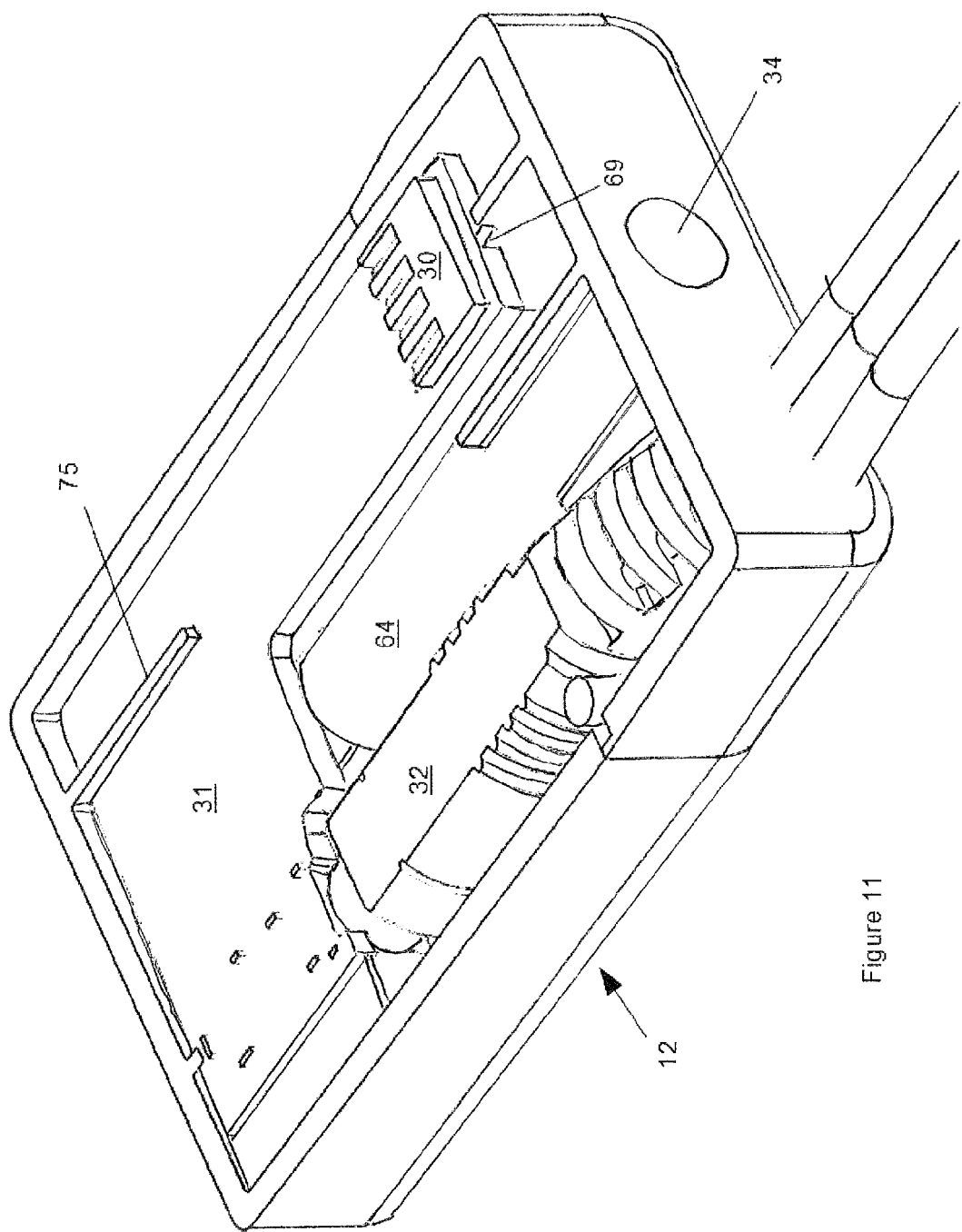
FIG. 11 is a horizontal longitudinal cross-sectional view of a housing for a harness assembly.
Figure 12:
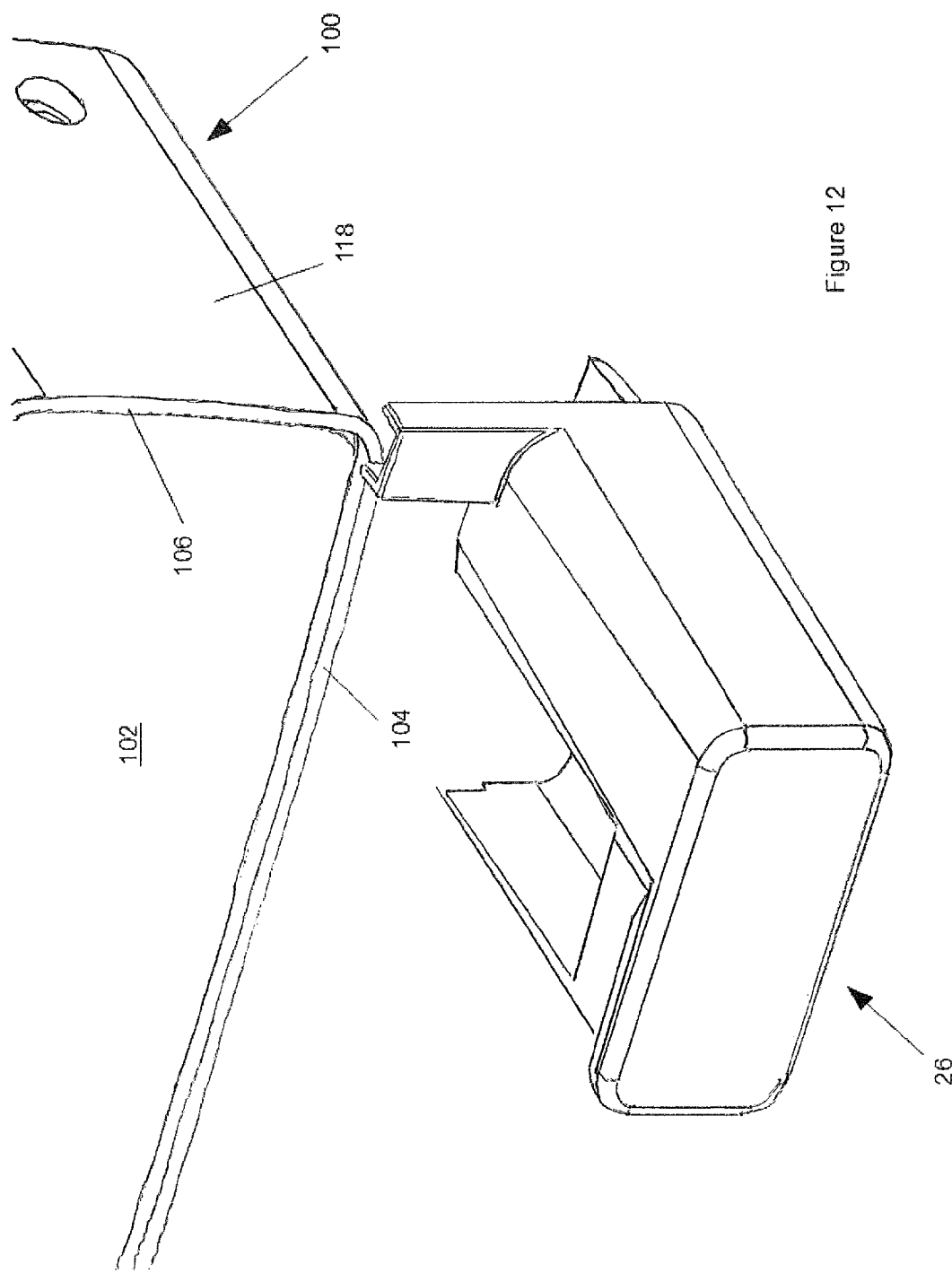
FIG. 12 is a front view of one housing portion about to be coupled to a portable electronic consumer product.
Figure 13:
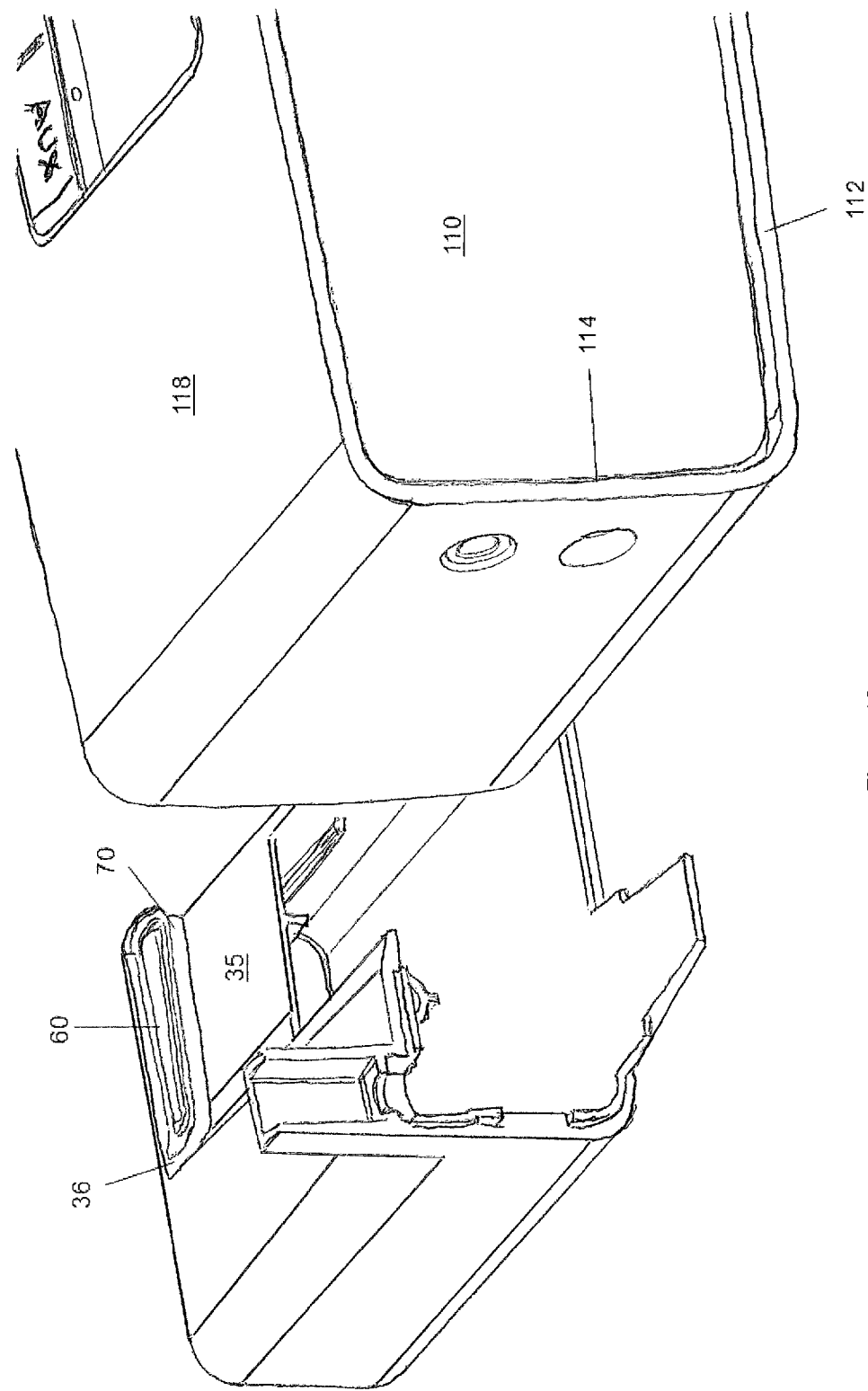
FIG. 13 is a rear view of the housing portion about to be coupled to a portable electronic consumer product.

In order to accomplish this fit, housing 12 defines slots that are located, constructed and arranged to engage with these four ridges. Because the housing needs to envelop a bottom corner of the consumer product, the housing needs to be shaped to accept this corner of the consumer product in a manner that the slots properly engage the four ridges. The construction of housing 12 is shown in FIGS. 3 and 4, while the separate front and rear housing portions 26 and 28 are shown in FIGS. 8 and 9. Front housing portion 26 has a generally hollow interior with features 66 and 61 located in the interior. Rear housing portion 28 also includes a generally hollow interior with features 64 and 71 located therein. The function of these features is further described below.

When the housing portions are coupled together to define the housing that is shown in FIGS. 3 and 4, the housing defines an open area 72 into which a bottom corner of consumer product 100 can snugly fit. Open area 72 is defined by openings in top 39 and side 40 of housing portion 28 and adjoining openings in top 38 and side 37 of housing portion 26. To accept one slightly rounded bottom corner of the product, corner cradling surface 35 of portion 26 is designed to have a complementary arc shape to provide a surface against which product 100 can seat. Front housing portion 26 defines generally vertical slot 36 that engages with side ridge 106 of front 102 of product 100 and generally horizontal slot 70 that engages with bottom ridge 104 of front 102 of product 100. Slots 36 and 70 are defined by protrusion 60. In a similar fashion, rear housing portion 28 comprises a protrusion 55 that defines horizontal slot 54 and vertical slot 53 that are adapted to engage with bottom ridge 112 and side ridge 114 of the back 110 of product 100. Because of the inclusion of an electrical contact set that is further described below, housing portion 28 does not include a product cradle surface such as surface 35.

In this non-limiting example, the data and power are provided to the consumer product via electrical contact with four electrical contacts or pads located on the outside and near the bottom corner of the product (not shown); these pads are data and power input connectors. Electrical contact is made with these pads with spring contact set 30 that comprises four separate contacts that are arranged and spaced to electrically contact the pads when housing 12 is coupled to product 100 as described herein. Contact set 30 is carried on the top generally planar surface of printed circuit board 31 that is removably captured in the interior of the housing by mechanical features located on the insides of the housing portions. Because of this construction, the entire housing can be assembled with a single screw or other type of fastener 51 that passes through fastener tunnel 64 and is accepted in fastener receiving opening 61. Guiding/alignment ridges 57, 58 and 59 fit in shoulders in the other housing portion to help to align the two housing portions as they are pulled together when screw 51 is tightened.

In this non-limiting example, cord assembly 14 enters housing 12 via an opening 65 formed between tongue 56 of housing portion 26 (which fits in opening 63) and the arch 74 in back face 29 of housing portion 28. Fastener opening 34 is also defined in face 29. The data and power cords of cord assembly 14 are both terminated by a multiple conductor plug 32 that fits into jack 48 that is carried at the bottom of printed circuit board 31. This allows the printed circuit board to carry both power and data to the spring contact set and thus into the pads of the consumer product. As an alternative, consumer product 100 includes power input jack 119 and the power cord could be carried through the housing to be coupled to this jack in a similar manner to the way that audio input plug 19 and the audio cord are carried by and held in place by the housing but available to be plugged into audio input jack 101.

In this example, audio cord 73 runs through the housing and out of the top of the housing through vertically extending audio cord retention tower 44 that comprises tower portions 45 and 46 that come together when the housing portions are fastened together. Tower 44 defines an exit opening that complements the shape of the audio input plug housing 18 so that housing 18 is tightly held in tower 44. When plug 19 is inserted into jack 101, this aspect accomplishes another point of connection between assembly 10 and consumer product 100, with such connection point offset from the part of the housing that is coupled to product 100. This strengthens and stiffens the connection between the housing and the consumer product, which makes the housing more difficult to twist off of the product. Using tower 44 to carry the cord rather than running the cord entirely through the main portion of the housing also keeps the main body of the housing smaller so that the housing is lighter, less obtrusive, uses less plastic and is less expensive to manufacture.

Printed circuit board 31 is captured within the housing by including generally co-planar features 66, 67 and 71 on which the printed circuit board rests. The top of portion 68 of member 71 is generally coplanar with the tops of member 66 and 67 to provide three points on which the printed circuit board rests. Face 62 of fastener tunnel 64 presses against PCB 31 to help hold it in place in the assembled housing. The lower surface of rib 75 sits just above the top of the PCB to help hold it in place.

Figure 15:
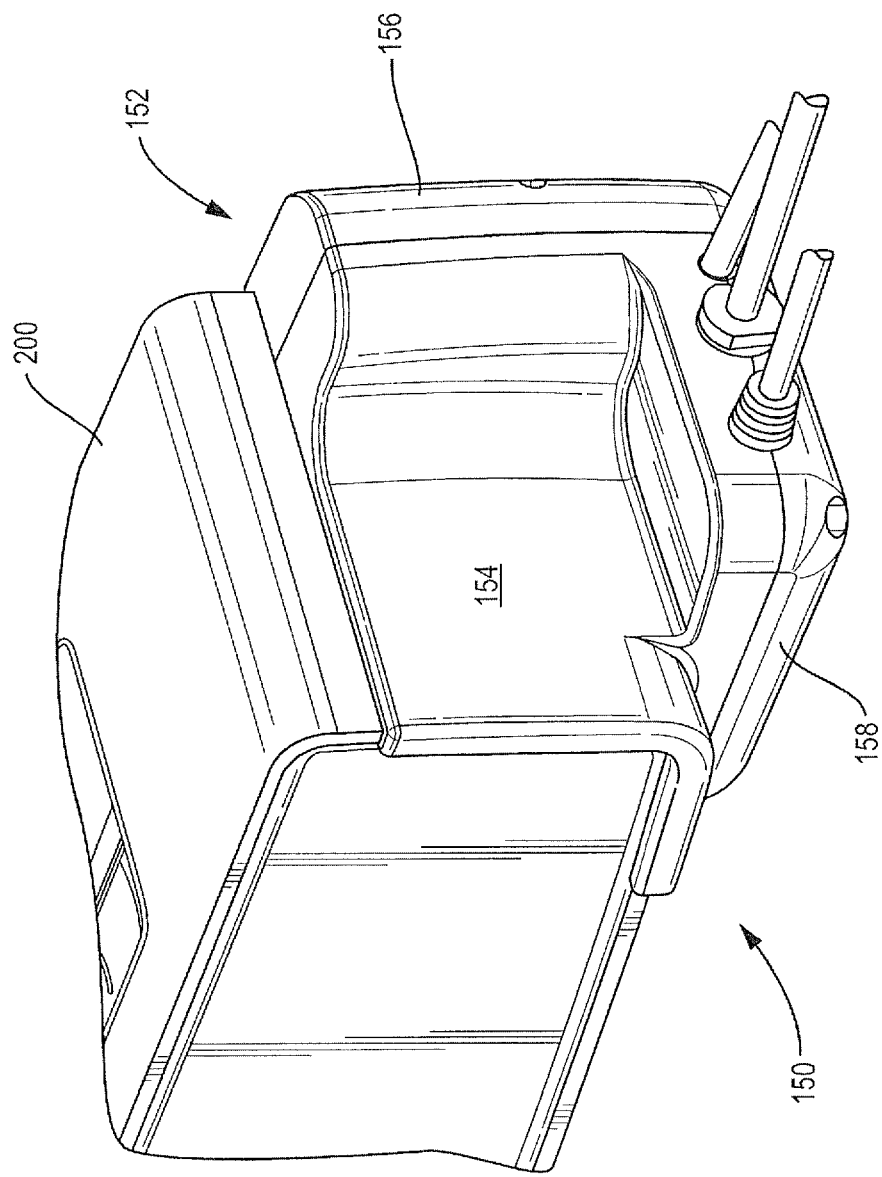
FIG. 15 is front perspective view of a second harness assembly coupled to a portable electronic consumer product.
Figure 16:
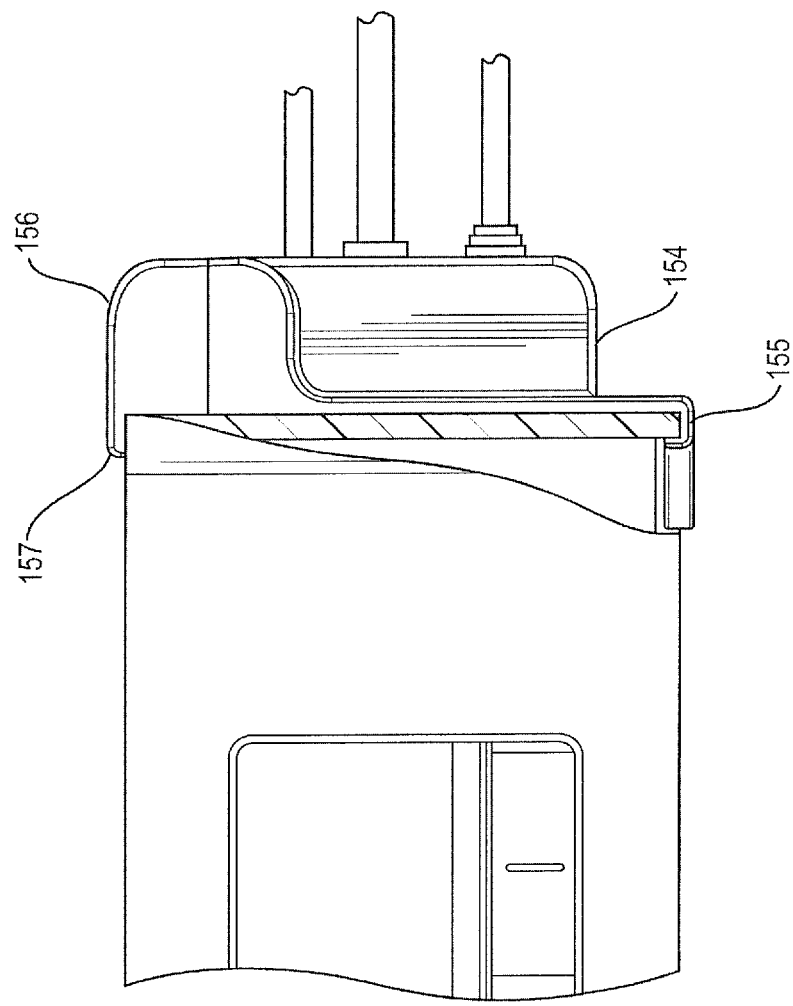
FIG. 16 is a top cutaway view of the second housing about to be coupled to a portable electronic consumer product.

A second example of the harness assembly is shown in FIGS. 14 through 16. Harness assembly 150 differs from harness assembly 10 primarily in the construction and arrangement of housing 152 which in this case comprises three portions 154, 156 and 158. The printed circuit board 160 is captured in lower portion 158 that is coupled to the bottom of portion 154 by two screws, the PCB sits between screw bosses 173 and 174. Portions 154 and 156 are coupled together with two screws that sit in bosses 171 and 172. Housing portions 154 and 158 define matching openings that capture plugs 162 and 163 and audio cable 165. The complementary housing retention features in this case comprise slots in "U"-shaped edge portions 155 and 157 of housing portions 154 and 156, respectively. The slots mate with ridges in the consumer product of the type described above. However, in this case the slots are defined in elongated "L"-shaped edge extension portions that couple with more of the length of the side and bottom protruding ridges of product 200. Also in this case housing 152 has a height that fully encompasses the audio plug 164.

Figure 17A:
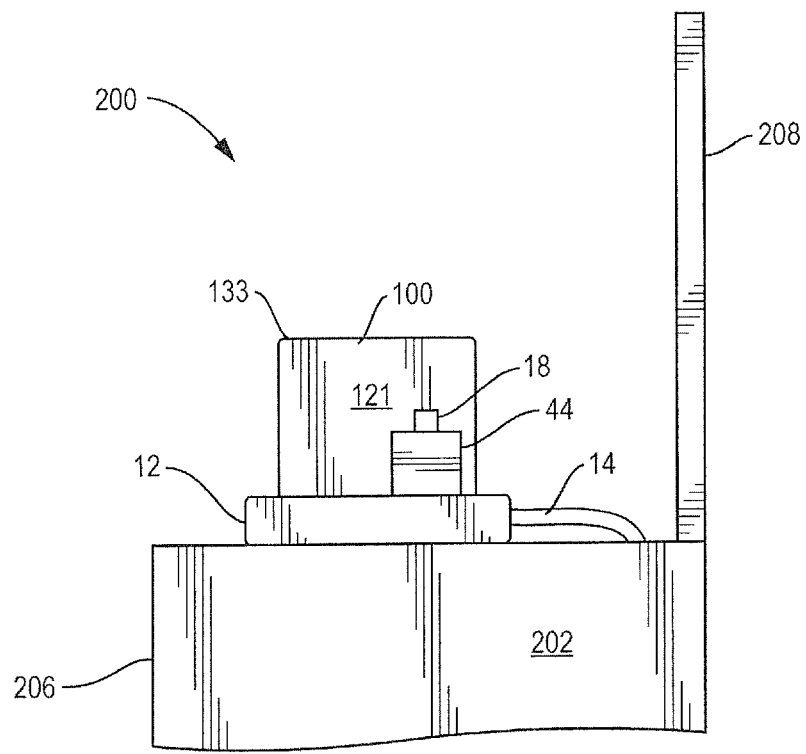
FIGS. 17A and 17B are side and partial top views, respectively, of a retail display that uses a harness assembly.
Figure 17B:
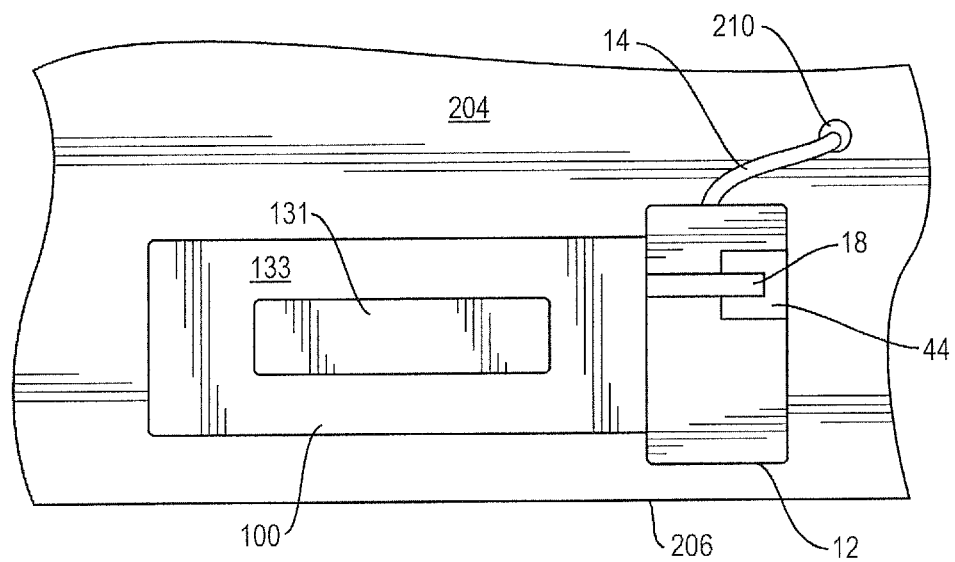

FIGS. 17A and 17B show an example of a retail display that uses the harness assembly shown in FIGS. 1-13 to provide power, data and stereo audio signals to a wireless loudspeaker of the type also shown in FIGS. 1-13. Retail display 200 includes display base 202 that has deck 204 and front engagement panel 206 along with rear vertical backboard 208. Display 200 can be a free-standing display or can be constructed and arranged to sit on a shelf or other support structure. Wireless speaker 100 sits on display deck 204. Housing 12 is coupled to speaker 100 with tower 44 holding audio input plug housing 18 with the audio plug inserted into the audio jack on side 121 of product 100. As described above, power and data connections are made through pads on the bottom of product 100. Cord assembly 14 acts to tether the product to the display. One non-limiting example of how this can be accomplished is to run cord 14 through an opening 210 in deck 204. The cord can then be held in a strain relief clamp (not shown) that is fastened to the underside of the display deck. Other mechanical structures to physically hold the cord to the retail display, or to another structure in the retail environment that is close to the retail display, may alternatively be used. There is enough slack in the cord to allow a consumer to pick the product up off of the deck and look at it and potentially even operate the product's operational controls 131 located on its top side 133.

A number of implementations have been described. Nevertheless, it will be understood that additional modifications may be made without departing from the scope of the inventive concepts described herein, and, accordingly, other embodiments are within the scope of the following claims.

What is claimed is:

1. An assembly for physically securing, and providing data and power to, a portable electronic consumer product that has opposed sides that each include a protruding ridge, where the portable electronic consumer product also has an electrical power input connector and a data input connector, the assembly comprising:

first and second separate housing portions that are constructed and arranged to be separably coupled together to thereby define a housing with an interior, where the first and second housing portions each define a complementary slot that fits over a ridge when the first and second housing portions are coupled together around the consumer product such that the housing forms a tight locational clearance fit with the consumer product when the first and second housing portions are coupled together around the opposed sides of the consumer product;

a cord assembly that is constructed and arranged to carry electrical power and data, the cord assembly located in part inside the housing;

a housing power connector that terminates the power carried by the cord assembly and is constructed and arranged to electrically couple with the power input connector of the consumer device; and a housing data connector that terminates the data carried by the cord assembly and is constructed and arranged to electrically couple with the data input connector of the consumer device;

where the housing power connector and the housing data connector are both carried by the housing.

2. The assembly of claim 1 wherein the consumer product has a generally rectangular parallelepiped shape with a generally rectangular front face and a generally rectangular rear face that are both framed by a thin housing envelope member that protrudes slightly from both faces to define the ridges.

3. The assembly of claim 2 wherein the first and second housing portions are each constructed and arranged to engage two adjacent edges of the housing envelope member.

4. The assembly of claim 3 wherein the first and second housing portions each have two slots that lie along generally orthogonal axes, where each slot is constructed and arranged to engage one edge of the housing envelope member.

5. The assembly of claim 3 wherein the slots of the first and second housing portions are constructed and arranged to engage the two adjacent edges of one face of the consumer product.

6. The assembly of claim 1 further comprising an electrical assembly located in the housing interior, where the housing power connector and the housing data connector are part of the electrical assembly.

7. The assembly of claim 6 wherein the electrical assembly is removably captured by mechanical features on the insides of the housing portions.

8. The assembly of claim 6 wherein the electrical assembly comprises a printed circuit board (PCB) that defines a top face.

9. The assembly of claim 8 wherein the housing power connector and the housing data connector comprise spring contacts that protrude from the top face of the PCB.

10. The assembly of claim 9 wherein the first and second housing portions are constructed and arranged to engage with each other along a coupling axis, and wherein the top face of the PCB is generally parallel to the coupling axis.

11. The assembly of claim 10 wherein the housing has a top and an adjacent side, the top and side both being partially open so as to define an opening that is constructed and arranged such that a corner of the consumer product fits snugly into the opening and the spring contacts thereby become electrically coupled to pads located on a surface of the consumer product, where the pads define the electrical power input connector and the data input connector.

12. The assembly of claim 1 wherein the electrical power and the data are carried by separate conductors of the cord assembly, and further comprising a multiple conductor plug at an end of the cord and that is electrically coupled to the power and data cord conductors.

13. The assembly of claim 1 where the cord assembly further comprises an audio cord that carries audio data and is located in part in the housing.

14. The assembly of claim 13 wherein the audio cord terminates in a plug that is constructed and arranged to be plugged into an audio jack of the consumer product, wherein the audio cord is held in the housing at a location close to the plug.

15. The assembly of claim 14 wherein the housing has a top surface and a tower that projects from the top surface and has an opening, where the audio cord runs through the tower and exits through its opening.

16. An assembly for physically securing, and providing data and power to, a portable electronic consumer product that has opposed sides that each include two intersecting edges, where the portable electronic consumer product also has an electrical power input connector and a data input connector, the assembly comprising:
    first and second separate housing portions that are constructed and arranged to be separably coupled together to thereby define a housing with an interior, wherein the first housing portion defines features that are complementary to the two intersecting edges on one side of the consumer product and the second housing portion defines features that are complementary to the two intersecting edges on the other side of the consumer product such that the housing forms a tight locational clearance fit with the consumer product when the first and second housing portions are coupled together around the opposed sides of the consumer product;
    a cord assembly that is constructed and arranged to carry electrical power and data, the cord assembly located in part inside the housing;
    a housing power connector that terminates the power carried by the cord assembly and is constructed and arranged to electrically couple with the power input connector of the consumer device; and
    a housing data connector that terminates the data carried by the cord assembly and is constructed and arranged to electrically couple with the data input connector of the consumer device;
    where the housing power connector and the housing data connector are both carried by the housing.

17. The merchandise display of claim 16 further comprising an electrical assembly located in the housing interior, where the housing power connector and the housing data connector are part of the electrical assembly.

18. The merchandise display of claim 16 wherein the electrical power and the data are carried by separate conductors of the cord assembly, and further comprising a multiple conductor plug at an end of the cord and that is electrically coupled to the power and data cord conductors.

19. The merchandise display of claim 16 where the cord assembly further comprises an audio cord that carries audio data and is located in part in the housing.

20. An assembly for physically securing, and providing data and power to, a portable electronic consumer product that has opposed sides that each include one or more protrusions or depressions, wherein the consumer product has a generally rectangular parallelepiped shape with a generally rectangular front face and a generally rectangular rear face that are both framed by a thin housing envelope member that protrudes slightly from both faces to define ridges on two adjacent edges, and where the portable electronic consumer product also has an electrical power input connector and a data input connector, the assembly comprising:
    first and second separate housing portions that are constructed and arranged to be separably coupled together to thereby define a housing with an interior;
    wherein the first and second housing portions each have two slots that lie along generally orthogonal axes and that each fit over a ridge when the first and second housing portions are coupled together around the opposed sides of the consumer product such that the housing forms a tight locational clearance fit with the consumer product;
    a cord assembly that is constructed and arranged to carry electrical power, data and audio signals, the cord assembly located in part inside the housing;
    a housing power connector that terminates the power carried by the cord assembly and is constructed and arranged to electrically couple with the power input connector of the consumer device;
    a housing data connector that terminates the data carried by the cord assembly and is constructed and arranged to electrically couple with the data input connector of the consumer device;
    a printed circuit board (PCB) that defines a top face and that is located in the housing interior and is removably captured by mechanical features on the insides of the housing portions, where the housing power connector and the housing data connector comprise spring contacts that protrude from the top face of the PCB;
    wherein the first and second housing portions are constructed and arranged to engage with each other along a coupling axis, wherein the top face of the PCB is generally parallel to the coupling axis, and wherein the housing has a top and an adjacent side, the top and side both being partially open so as to define an opening that is constructed and arranged such that a corner of the consumer product fits snugly into the opening and the spring contacts thereby become electrically coupled to pads located on a surface of the consumer product, where the pads define the electrical power input connector and the data input connector; and
    wherein the audio cord terminates in a plug that is constructed and arranged to be plugged into an audio jack of the consumer product, wherein the audio cord is held in the housing at a location close to the plug, and wherein the housing has a tower that projects from its top surface and has a top opening, and the audio cord runs through the tower and exits through its top opening.

21. A merchandise display for a portable electronic consumer product that has a generally rectangular parallelepiped shape with a generally rectangular front face and a generally rectangular rear face that are both framed by a thin housing envelope member that protrudes slightly from both faces to define protruding ridges, where the portable electronic consumer product also has an electrical power input connector member and a data input connector member, wherein the consumer product has a bottom and an adjacent side, where at least one of the electrical power input connector member and the data input connector member are located on the bottom surface, the merchandise display comprising:
    i) a display structure comprising a deck that is constructed and arranged to support the consumer product; and
    ii) a harness assembly for physically securing, and providing data and power to, the consumer product, the harness assembly comprising:
        first and second separate housing portions that are constructed and arranged to be separably coupled together to thereby define a housing with an interior, where the first and second housing portions are each constructed and arranged to engage two adjacent edges of the housing envelope member and wherein the first and second housing portions each have two slots that lie along generally orthogonal axes, where each slot is constructed and arranged to fit over one edge of the housing envelope member such that the housing forms a tight locational clearance fit with the consumer product when the first and second housing portions are coupled together around the opposed sides of the consumer product;

a cord assembly that is constructed and arranged to carry electrical power and data, the cord assembly located in part inside the housing and also physically coupled to the display structure; and a plurality of electrical connectors carried by the housing and configured to establish electrical connections between the cord assembly and the consumer product, where the electrical connectors comprise a housing power connector member that terminates the power carried by the cord assembly and is constructed and arranged to electrically couple with the power input connector member of the consumer product, and a housing data connector member that terminates the data carried by the cord assembly and is constructed and arranged to electrically couple with the data input connector member of the consumer product, where at least one of the housing power connector member and the housing data connector member are constructed and arranged to electrically couple with the input connector members on the bottom surface of the consumer product when the housing portions are coupled together around the bottom and side of the consumer product.

22. The merchandise display of claim 21 further comprising a printed circuit board (PCB) that defines a top face, where the PCB is located in the housing interior and removably captured by mechanical features on the insides of the housing portions, where the housing power connector member and the housing data connector member each comprise spring contacts that protrude from the top face of the PCB, wherein the first and second housing portions are constructed and arranged to engage with each other along a coupling axis, and wherein the top face of the PCB is generally parallel to the coupling axis, the housing has a top and an adjacent side, the top and side both being partially open so as to define an opening that is constructed and arranged such that a corner of the consumer product fits snugly into the opening and the spring contacts thereby become electrically coupled to pads located on a surface of the consumer product, where the pads define the electrical power input connector member and the data input connector member.

* * * * *